United States Patent [19]
Amundson et al.

[11] 3,939,770
[45] Feb. 24, 1976

[54] SHORT RANGE PASSIVE ELECTROMAGNETIC DETECTOR

[75] Inventors: Paul H. Amundson, China Lake, Calif.; Prescott D. Crout, Lexington, Mass.

[73] Assignee: The United States of America as represented by the Secretary of the Navy, Washington, D.C.

[22] Filed: Dec. 22, 1971

[21] Appl. No.: 211,136

[52] U.S. Cl. .......... 102/19.2; 102/70.2 P; 340/258 C
[51] Int. Cl.² .......................................... F42C 13/08
[58] Field of Search .......... 102/10, 18, 19.2, 70.2 R, 102/70.2 P, 70.2 G, 70.2 GA, 70.2 I, 86.2; 340/258 B, 258 C, 233; 324/DIG. 1

[56] References Cited
UNITED STATES PATENTS

| | | |
|---|---|---|
| 2,640,978 | 6/1953 | Claesson et al. ................. 340/258 C |
| 2,673,340 | 3/1954 | Johansson et al. ............... 340/258 C |
| 3,493,954 | 2/1970 | Bartlett et al. .................. 340/38 L X |
| 3,697,971 | 10/1972 | Domin ............................ 340/258 C |

*Primary Examiner*—Charles T. Jordan
*Attorney, Agent, or Firm*—R. S. Sciascia; Roy Miller

[57] ABSTRACT

A short range passive detector for detonating a mine comprising a bridge circuit which utilizes the mine tripwire wire-to-ground capacitance as one arm of the bridge and associated circuitry for zero adjusting the bridge automatically to render the bridge independent of wire-to-ground height and yet allow sudden changes of capacitance to cause mine detonation.

1 Claim, 1 Drawing Figure

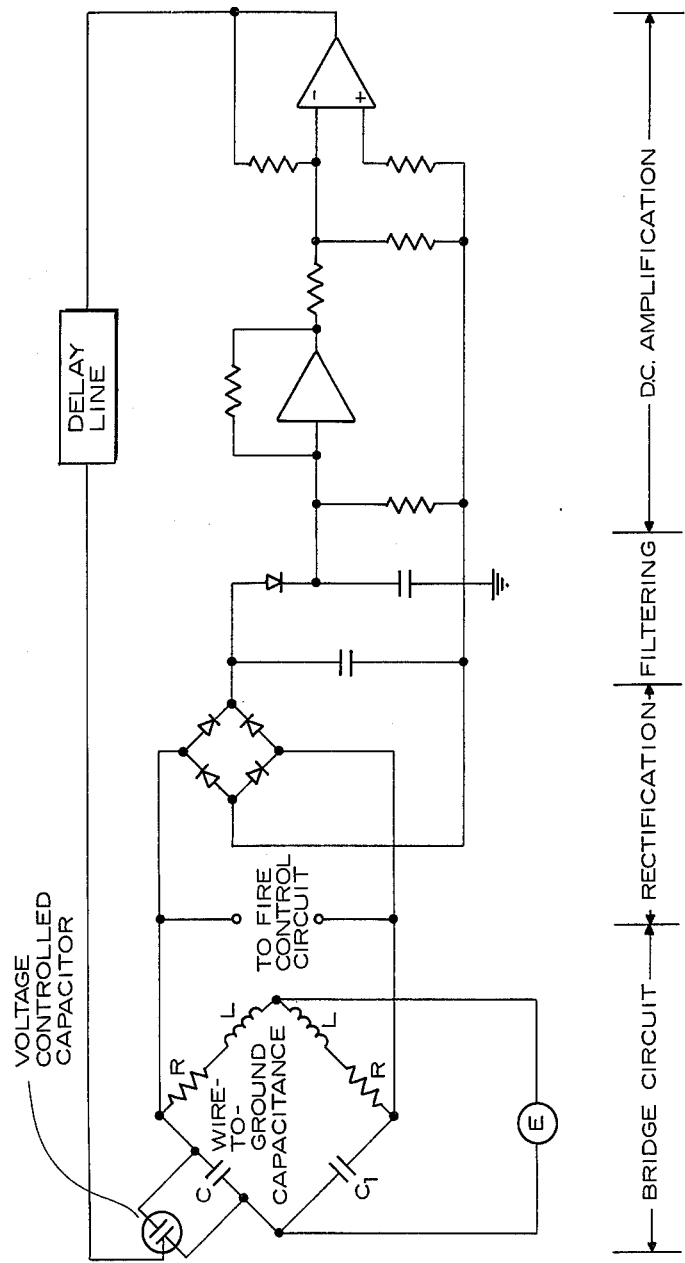

SHORT RANGE PASSIVE ELECTROMAGNETIC DETECTOR

BACKGROUND OF THE INVENTION

The present invention is concerned with the problem of causing detonation of a mine which is sown from the air. Shortly after such a mine strikes the ground, small wires are shot out from the mine. Subsequently, a tension of two to three ounces in any one of the wires will result in detonation of the mine. Although three ounces seems rather small, it has been found that the wires can be felt by the sensitive parts of the arms and hands of a human before sufficient force has been exerted to explode the mine. When this happens, of course, the mine can be inactivated and/or avoided.

The invention is concerned with providing an electrical system which can be contained within the mine and which is such that mere proximity to a tripwire is sufficient to explode the mine.

DESCRIPTION OF THE PRIOR ART

No devices are known at present which will accomplish the desired aim of the present invention, however, various object detectors are known one of which is exemplified by U.S. Pat. No. 3,493,954. This device utilizes an inductive loop buried in a roadway to detect the presence of vehicles. The device provides an oscillator means for providing a reference frequency voltage signal; a normally balanced impedance bridge having four arms and compensating means coupled to one arm of the bridge for compensating for the change in the value of the variable impedance to return the bridge to a balanced condition. The unbalanced condition may be caused by moisture on the inductive loop, a partial breakdown of insulation material, temperature changes, etc., among others.

Generally speaking the differences between the Bartlett et al. device and the present invention are: (1) the sensing devices are different in that Bartlett et al. uses an inductive loop buried in the roadway while the present invention utilizes the capacitance between a tripwire and ground; (2) the reference structure implies a medium range detection capacity of two to ten feet while the present invention is specifically designed for extremely short ranges, i.e., half inch or less; (3) the sensing mechanism of the patent requires medium power input (in the milliwatt range at least) while the present invention is a very low powered device, i.e., microwatts or less.

In addition, the higher power inherent in the reference sensing mechanism makes the structure very susceptible to countermeasure and the manner in which the invention is implemented connotes a permanent installation while the present invention is concerned with portability. The Bartlett et al. device could not be remotely deployed, that is to say, the sensing loop is buried in a roadway.

SUMMARY OF THE INVENTION

Briefly, the invention comprises a bridge circuit with a feedback loop and an adjustable capacitance in parallel with the leg of the loop incorporating the wire-to-ground capacitance of a mine. In operation, the bridge will be restored to balance by the feedback loop so that the bridge will not respond to slow changes which might be brought about by variances in height between a tripwire and ground while at the same time responding to fast changes such as a body approaching a tripwire. This is accomplished through incorporation of a delay line between the output of the feedback circuit and the variable capacitance in parallel with the one leg of the balanced bridge.

BRIEF DESCRIPTION OF THE DRAWING

The FIGURE is a schematic diagram of the preferred embodiment of the invention.

DESCRIPTION OF THE PREFERRED EMBODIMENT

Basically, the only electrical quantity which is available to work with is the wire-to-ground capacitance of the mine tripwires. Each of the wires which are shot from the mine is approximately 30 feet long, 0.004 inch in diameter and covered with a 0.001 inch thick sheet of nylon insulation. Various of the wires may extend into the air, depending on the vegetation on the ground, whereas others of the wires may be shot directly onto or into the ground itself.

In the FIGURE a balanced bridge is provided having one leg of the bridge incorporating the wire-to-ground capacitance, C, of the wires from the mine. A source of high frequency power, E, is applied across diagonal points of the bridge and the output from the bridge is taken at the opposite diagonals, rectified in a conventional bridge rectifier, filtered in a filtering circuit, dc amplified and coupled through a delay line back to a voltage controlled capacitor in parallel with the wire-to-ground capacitance. The fire control circuit is taken off across the bridge and upon some minimum unbalance of the bridge, detonates the mine.

In that the wire-to-ground capacitance varies dependent on the height of the wires with respect to the ground, the voltage controlled capacitor is provided so that upon the mine reaching the ground and once the wires are in a stable position the bridge may be nulled. This is accomplished by coupling the output of the bridge through a feedback circuit and using the output of the feedback circuit through the delay line to compensate for slow changes in the wire-to-ground capacitance. The delay line is used so that the bridge will respond to sudden and abrupt changes in the wire-to-ground capacitance such as that that might be caused by a vehicle and/or person approaching a tripwire.

Ignoring the nylon insulation, the capacitance to ground per meter length of the horizontal wire or radius r meters, whose center is h meters above the ground, is given by the relation $$C_g = \frac{24.2}{\log\left[\frac{h}{r} + \sqrt{\left(\frac{h}{r}\right)^2 - 1}\right]} \quad (1)$$

(See J. D. Crouse, "Electromagnetics," page 79).

As an example, let $C_0$ be the capacitance of a horizontal wire 30 feet long and 0.004 inch in diameter whose center is three feet above the ground; then $C_0 = 48.6 \ \mu\mu f$.

There is some fringing of the electric field at the ends of the wire, however, this is neglected in that it should not have much effect on the capacitance since most of the wire-to-ground voltage is concentrated near the wire.

In another example, if the height of the wire were five (5) feet above ground the capacitance would be 46.4

μμf.

If the height of the wire were 1 foot above ground the capacitance would be 74.0 μμf.

By way of another example, suppose a wire one foot in length were at a height of 0.10 inch above ground. Then C = 3.70 μμf. Here the 1 foot length corresponds to the width of a small man's body.

The capacitance of a 3 ½ inch length of wire at a height of 0.01 inch above ground is 2.17 μμf. The 3 ½ inch length approximates the width of a man's hand.

Finally, the capacitance of a 3 ½ inch length of wire at a height of 0.004 inch above ground is 3.77 μμf.

From the foregoing, it can be seen that change in capacitance due to the proximity of a man's body or hand to a wire is considerably smaller than the variation in capacitance due to different heights of the wire above ground. This requires the initial adjustment of the voltage controlled capacitor which must be made in order to remove the effect of the variation in capacitance due to the different possible initial positions of the wire.

It can be shown that the nylon covering introduces capacitance equal to $$24.2 \left[ 0.1158 + \log \frac{2h}{b} - \frac{0.4343}{1.249 \left(\frac{2h}{b}\right)^2 - 1} \right]^{-1} \mu\mu f \text{ per meter,}$$

where $b$ equals the outer radius of the sheath in meters.

The network output actuates a firing switch which explodes the mine, which output is preset at zero for any initial configuration of the wires and is then rendered different from zero by any subsequent change in the wire-to-ground capacitance. After the wires are shot into place the voltage controlled variable capacitor is adjusted so that the bridge is balanced in which case $C = C_1$. Any subsequent change in capacitance unbalances the bridge and produces an output.

The frequency of the exciting voltage E is the resonant frequency of the LC combination, hence the angular frequency is given by $\omega = \sqrt{1/LC}$ and the reactance of $C_1$ is the inverse of that of L. Because of this, the voltage at the output terminals of the bridge is relatively high despite the fact the input impedance and input current of the bridge are low.

In view of the small magnitudes of the capacitances with which the invention is concerned and in order to keep the physical dimensions of the network components as small as possible, the operating frequency will be high, in the radio frequency range. If, however, the wire and ground are to behave as a capacitor, the frequency must not be so high that the corresponding wavelength is less than approximately 4 times the length of the wire, which is about 36.6 meters. At higher frequencies, and even at the one above, the combination of wire and ground must be treated as a transmission line or antenna. In the bridge, no resistance is shown in those branches which contain the capacitances. Actually, there is dissipation in those parts of the electric field which lie in the area of material objects, such as trees and jungle growth as well as radiation. Since the frequency is fixed however, both of these losses can be taken care of by placing a suitable resistance either in series or parallel with the capacitors.

All previous target detecting devices for use in land mines in the past have required one or more of the following: (1) the target make contact with the detecting device, (2) a definite acoustic, seismic or electromagnetic target signature, (3) a large battery to supply the power for active target detection and/or (4) for human surveillance of the mine field to initiate the mine when the target was within the lethal radius. Devices that require physical contact or pressure for initiation are much easier to countermeasure than active or passive detectors. Devices that require the target to provide a signal to the mine are relatively easy to countermeasure. Devices that require active electronic target detection must devote a large space to the battery supply and bringing human surveillance into the mine picture removes many of the tactical options that air delivered mine fields are supposed to provide. In addition, the utility of human surveillance of the mine field at night is open to question.

The present invention provides a passive detection capability to air delivered mines without requiring a complicated detection scheme, a large power supply, physical contact with the detecting device or a specific target signature. In addition, the invention will make air delivered mines difficult to countermeasure. The capability is provided by using the wires as short-range electronic detectors.

What is claimed is:

1. A short range low power passive detector having a portion thereof with a certain device-to-ground capacitance comprising;

a bridge circuit having arm portions;

one arm of said bridge circuit comprising the devie-to-ground capacitance of said device;

additional capacitance connected in parallel with said first mentioned capacitance;

a feedback circuit connected across the output of said bridge circuit and having an output;

the output of said feedback circuit being connected to said additional capacitance means to adjust the additional capacitance means in response to unbalance in the bridge circuit caused by device-to-ground distance;

and delay means connected between the output of said feedback circuit and the additional capacitance means so that the device responds to rapid changes in capacitance in said one arm of the bridge and is returned to null balance by relatively slower changes caused by changes in device to ground distance.

* * * * *